United States Patent [19]

Costantini

[11] 4,429,362
[45] Jan. 31, 1984

[54] DATA BUFFER OPERATING IN RESPONSE TO COMPUTER HALT SIGNAL

[75] Inventor: John J. Costantini, Sommerville, N.J.

[73] Assignee: The Bendix Corporation, Teterboro, N.J.

[21] Appl. No.: 275,005

[22] Filed: Jun. 18, 1981

[51] Int. Cl.³ .............................................. G06F 3/04
[52] U.S. Cl. .................................................. 364/200
[58] Field of Search ... 364/200 MS File, 900 MS File

[56] References Cited

U.S. PATENT DOCUMENTS

| 3,633,169 | 1/1972 | Bickford | 364/200 |
|---|---|---|---|
| 4,035,777 | 7/1977 | Moreton | 364/200 |
| 4,047,159 | 9/1977 | Boudry | 364/200 |
| 4,071,911 | 1/1978 | Mazur | 364/900 |
| 4,130,883 | 12/1978 | Hazelton | 364/900 |
| 4,149,244 | 4/1979 | Anderson et al. | 364/200 |
| 4,212,080 | 7/1980 | Milliken | 364/900 |
| 4,282,512 | 11/1981 | Boggs et al. | 340/825.5 |

Primary Examiner—Jerry Smith
Assistant Examiner—Mark P. Watson
Attorney, Agent, or Firm—Anthony F. Cuoco; Thomas L. Adams

[57] ABSTRACT

A buffer can exchange data between a computer having a plurality of lines and a device. One of these lines, a halt line, can transmit a halt signal when the computer has halted. The buffer includes a plurality of transmitters and a plurality of controlled receivers. A halt transmitter is included among the plurality of transmitters. The transmitters are separately connected to predetermined respective ones of the plurality of lines for transmitting their signals to the device. The halt transmitter is connected to the halt line for transmitting the halt signal to the device. The receivers are connected between the device and given respective ones of the plurality of lines for coupling to them signals from the device. Each one of a predetermined set from the plurality of receivers has a receive terminal commonly connected to the halt line for enabling operation of this predetermined set in response to the halt signal.

10 Claims, 8 Drawing Figures

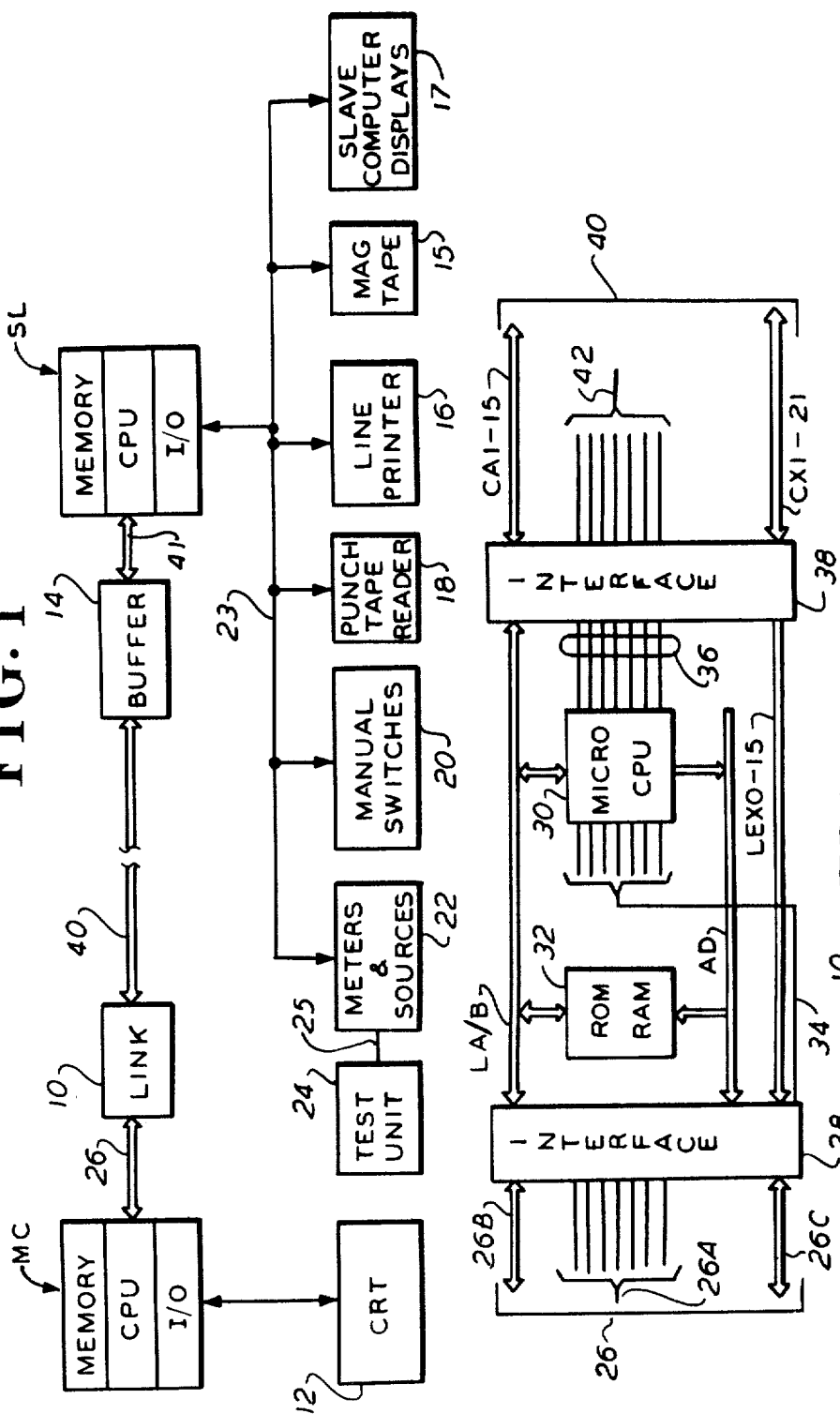

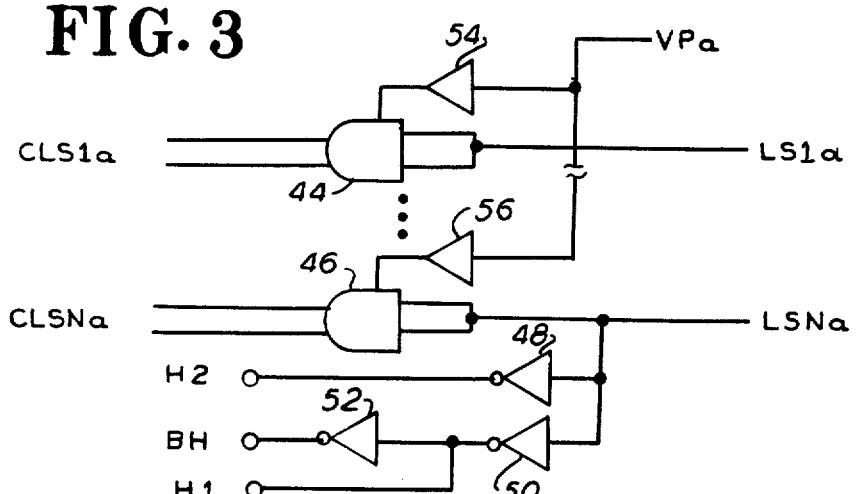
FIG. 3
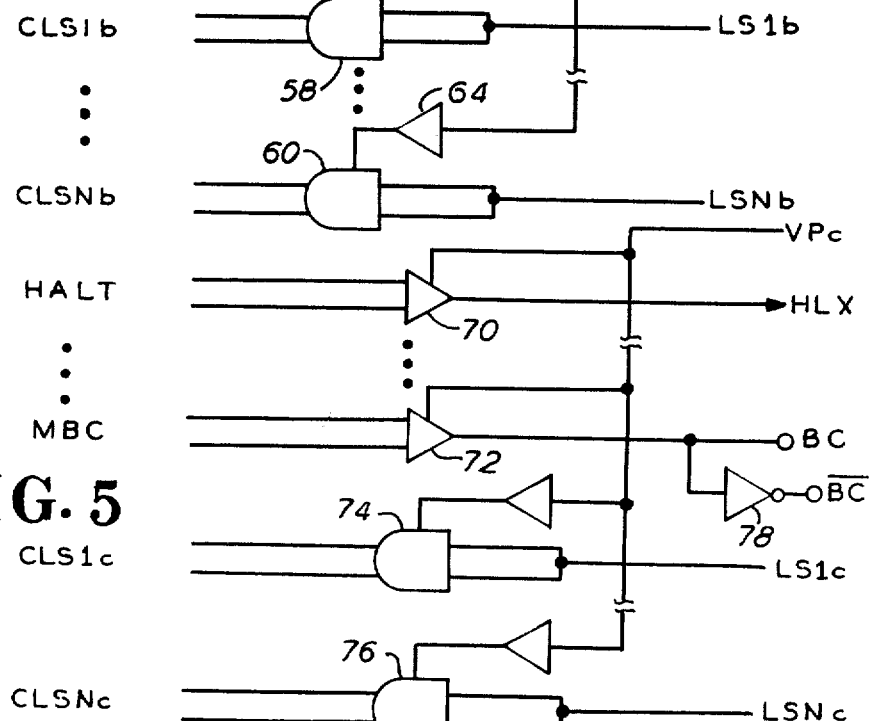
FIG. 4
FIG. 5

DATA BUFFER OPERATING IN RESPONSE TO COMPUTER HALT SIGNAL

BACKGROUND OF THE INVENTION

The present invention relates to data buffers and, in particular, to devices for exchanging information with a computer when it is halted.

It is known to transmit digital information over bus lines which terminate in receiving and transmitting circuits. These receivers and transmitters typically are integrated circuits designed to restore the signal level which may have become attenuated or noisy over a relatively long cable. Such receivers and transmitters can exchange digital data and can be effectively isolated from its associated bus line by a control signal. It is also known to halt or interrupt a computer so that certain important functions can be performed.

A disadvantage with known systems is their failure to design the buffers into the system to allow gating of data so that it is received at an appropriate time, for example, when the computer is halted. Known systems also fail to consider a buffer system whereby simplex communication can be effected in an orderly fashion.

Accordingly, there is a need for a simple and effective buffer for restoring digitial signal levels while allowing an orderly transfer of data to and from a computer.

SUMMARY OF THE INVENTION

In accordance with the illustrative embodiment demonstrating features and advantages of the present invention, there is provided a buffer for exchanging data between a device and a computer. The computer has a plurality of lines including a halt line. This halt line can transmit a halt signal when the computer has halted. The buffer includes a plurality of transmitting means (including a halt transmitter) and a plurality of controlled receiving means. The transmitting means are separately connected to predetermined respective ones of the plurality of lines and respond to the plurality of lines for transmitting their signals to the device. The halt transmitter is connected to the halt line for transmitting the halt signal to the device. The controlled receiving means are connected between the device and given respective ones of the plurality of lines for coupling to them signals from the device. Each one of a predetermined set from the plurality of receiving means has a receive terminal. The receive terminal is commonly connected to the halt line for enabling operation of the predetermined set in response to the halt signal.

Also, in accordance with the present invention there is provided a method for exchanging data between a device and a computer. This computer has a plurality of lines including a halt line. The halt line is operable to convey a halt signal when the computer has halted. The method includes the step of transmitting signals from predetermined respective ones of the plurality of lines to the device. The method also includes the step of coupling signals from the device to given respective ones of the plurality of lines when a halt signal is provided by the computer on the halt line.

By providing apparatus and methods of the foregoing type, an effective technique is provided for buffering data into and out of a computer in an orderly fashion. In a preferred embodiment, each member of a group among the address lines of the computer is connected to a parallel (pair) combination of a receiver and transmitter. Each of these paris is controlled by a halt line from the computer. The halt line is inverted to produce two signals: a direct and an inverted signal. The direct signal is used to operate a transmitter for forwarding information from the address lines of the computer. The inverted halt signal is used for operating receivers that couple information onto the address lines of the computer. Also in that preferred embodiment, certain ones of the address lines are connected to receivers which are not paralleled with transmitters.

Also in one embodiment, the receivers and transmitters exchange control signals with the computer. These receivers and transmitters are rendered operable and inoperable by signals internally generated by the computer.

It is contemplated that the buffer may be used to exchange data with the computer as it operates a test instrument that is diagnosing a test unit. The computer can respond to information received through the buffer to operate the test instrument. In turn, the computer can relay information gathered by the test instrument out through the buffer. The data thus requested and received can be used by an inspector to troubleshoot or evaluate a test unit.

Also in a preferred embodiment, a transmitter is connected to the halt line for forwarding that halt signal to an external device. In this embodiment, the external device is another computer used to control the computer transmitting the halt signal.

BRIEF DESCRIPTION OF THE DRAWINGS

The above brief description as well as other objects, features and advantages of the present invention will be more fully appreciated by reference to the following detailed description of a presently preferred but nonetheless illustrative embodiment in accordance with the present invention when taken in conjunction with the accompanying drawings wherein:

FIG. 1 is a block diagram of a data system including a buffer according to the present invention;

FIG. 2 is a more detailed block diagram of the link of FIG. 1;

FIG. 3 is a schematic diagram of a first portion of the buffer in FIG. 1;

FIG. 4 is a schematic diagram of a second portion of the buffer of FIG. 1;

FIG. 5 is a schematic diagram of a third portion of the buffer of FIG. 1;

DETAILED DESCRIPTION OF THE PREFERRED EMBODIMENT

Figure 6:
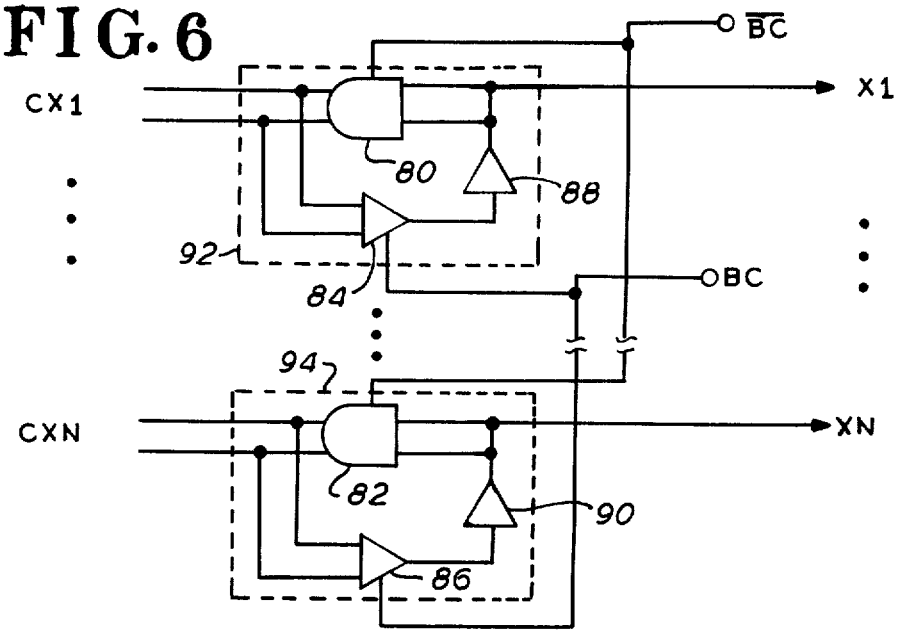
FIG. 6 is a schematic diagram of a fourth portion of the buffer of FIG. 1.

Referring to FIG. 1, link 10 is connected to a device, shown herein as master computer MC, by a plurality of lines 26. Computer MC is a general-purpose computer including as illustrated: memory, a central processing unit (CPU) and an input/output port (I/O). Master computer MC is shown connected to a display device, in this embodiment, cathode ray tube 12.

Link 10 is arranged to exchange data between master computer MC and slave computer SL. Since slave computer SL is located at a significant distance from link 10 a relatively long cable 40 comprising a plurality of lines connects between link 10 and buffer 14. Buffer 14 employs transmitting and receiving devices for restoring the signal levels that may be attenuated through cable 40. Buffer 14 is shown connecting directly to slave computer SL through a plurality of lines, whose signals correspond to the information on cable 40. Slave computer SL is shown with a slave memory having a plurality of memory cells, a central processing unit (CPU) and an input/output port (I/O). Slave computer SL is shown connected through its input/output port and lines 23 to a plurality of peripherals. Four such peripherals connected to it are conventional line printer 16, teletypewriter 18, magnetic tape memory 15 and computer displays 17. Also, connected in this fashion is a manual programmer shown herein as plurality of manual switches 20, one for each relevant bit. Switches 20 can be used to transmit a data word to slave computer SL for the purpose of controlling programming, reprogramming or debugging programs of slave computer SL. Also connected lines 23 to slave computer SL are a rack of test instruments and stimulating devices 22. These test instruments may include voltmeters, frequency counters, ammeters, etc. These instruments can be operated by the signals transmitted on lines 23 by slave computer SL to cause instruments 22 to relay back on lines 23 operating parameters measured by them. Instruments 22 connect to a unit under test 24 through a test terminal shown herein as interconnecting lines 25. The stimulating devices in block 22 may include current sources and voltage sources of various types which provide through probes in lines 25 stimulating signals to test the performance of unit 24.

Referring to FIG. 2, previously illustrated link 10 is shown herein in further detail. A group of lines 26 that are internal to the previously mentioned master computer (computer MC of FIG. 1) connected to interface device 28 which is also internal to that master computer. Lines 26 consist of conventional control lines 26A, data lines 26B and address lines 26C. Interface 28 connects to address lines AD which are bussed to a microprocessor 30 and memory subsystem 32, the latter comprising a group of read only and random access memories. Microprocessor 30 and memory 32 can exchange data with data line LA/B which also connects to interface 28. A group of control lines 34 from microprocessor 30 connects to interface 28. Microprocessor 30 also has another group of control lines 36 separately connected to interface 38. Interface 38 has a group of sixteen data lines LEXO-15 which together with data lines LA/B form a group referred to herein as a plurality of information lines. The other lines 40 form interface 38 connect to the previously mentioned slave computer (computer SL of FIG. 1). Lines 40 includes another plurality of information lines CX1-21 (comprising 21 lines in this embodiment) control lines 42 and fifteen address lines CA1-15. Interface 38 transmits data on lines LEXO-15 and CA1-15. Interface 38 also exchanges data with data lines LA/B and CX1-21. It will be noted that in this embodiment, the foregoing data lines are incompatible.

Referring to FIG. 3, a portion of the buffer (buffer 14 of FIG. 1) is illustrated. A plurality of transmitting means are shown as controlled transmitters 44 and 46. These transmitters are also referred to as a third preselected set from the plurality of transmitting means. The ellipses between transmitters 44 and 46 indicate that duplicate transmitters have been deleted to simplify the illustration. The output lines of transmitters 44 and 46 are balanced, complementary data lines CLS1a and CLSNa, respectively, which are part of the control lines 42 of FIG. 1. Transmitters 44 and 46 are AND gates whose pairs of inputs are commonly connected to lines LS1a and LSNa, respectively, the latter lines being referred to as a plurality of control lines connecting to computer SL. Line LSNa is a halt line which also connects to the inputs of inverters 48 and 50 whose outputs are identified herein as terminals H2 and H1, respectively. Terminal H1 also connects to the input of inverter 52 whose output terminal is identified as terminal BH.

Transmitters 44 and 46 are commercially available line drivers that can replicate the digital signal on their inputs, provided they receive an enabling signal from amplifiers 54 and 56, respectively. The inputs of amplifiers 54 and 56 are commonly connected to control line VPa to receive a signal generated by computer SL (FIG. 1). It will be appreciated that the other transmitters as employed in this figure, each have a similar amplifier whose input is commonly connected to line VPa.

Referring to FIG. 4, additional members of the previously mentioned third preselected set are shown herein as transmitters 58 and 60 having balanced output lines CLS1b and CLSNb, respectively. Transmitters 58 and 60 are members of a larger group as indicated by the ellipses between them. Those unillustrated members were deleted to simplify the illustration. Transmitters 58 and 60 connect to control lines LS1b and LSNb, respectively, of the slave computer SL (FIG. 1). Transmitters 58 and 60 also have associated therewith driving amplifiers 62 and 64, respectively, whose inputs are commonly connected to control line VPb. An enabling signal on line VPb causes transmitters 58 and 60 to relay the data on lines LS1b and LSNb to their respective output lines, CLS1b and CLSNb. The latter lines are part of control line group 42 (FIG. 2).

A plurality of controlled receiving means is shown herein as a third preselected group of receivers 66 and 68 whose balanced inputs are identified as lines CLM1b and CLMNb, respectively (from lines 42 of FIG. 2). Receivers 66 and 68 are members of a larger group, as suggested by the ellipses between them. Receivers 66 and 68 can relay input data to their output lines LM1b and LMNb, respectively, when a driving signal is connected to their common enabling terminal VPb. Terminal VPb is a control line of computer SL (FIG. 1). Lines LM1b and LMNb are control lines of the slave computer SL (FIG. 1). It will be observed that receivers 66 and 68 are phased oppositely from transmitters 58 and 60. Thus, when the signal on line VPb is high receivers 66 and 68 are operable while transmitters 58 and 60 operate when the signal line VPb is low.

It will be understood that when disabled, the receivers or transmitters illustrated in this application present a high output impedance. It will also be appreciated that the illustrated receivers and transmitters can be operated in different time intervals by being driven by different control lines.

Referring to FIG. 5, a schematic is given that is essentially identical to that of FIG. 4 except that it connects to different lines. In particular, the previously mentioned lines VPb, LM1b, LMNb, LS1b, LSNb, CLM1b, CLMNb, CLS1b and CLSNb are replaced herein by lines VPc, HLX, BC, LS1c, LSNc, HALT, MBC, CLS1c and CLSNc, respectively. Similarly, transmitters and receivers previously identified as elements 66, 68, 58 and 60 are identified herein as elements 70, 72, 74 and 76, respectively. In addition, the input of inverter 78 is shown herein connected to line BC, its output connecting to terminal $\overline{BC}$.

In this embodiment, line HALT conveys a command for computer SL (FIG. 1) to halt, transmitted from master computer MC (FIG. 1). This halt signal is applied by receiver 70 to line HLX thereby providing slave computer (SL) an indication that a request to halt has been entered for the purpose of transferring data.

Referring to FIG. 6, a second preselected set from a plurality of transmitting means is shown herein as transmitters 80 and 82 having balanced output lines CX1 and CXN, respectively. Transmitters 80 and 82 are in the form of AND gates whose input pairs are connected to data lines X1 and XN, respectively. A second preselected group from a plurality of receiving means is shown herein as receivers 84 and 86, having balanced inputs also connected to lines CX1 and CXN, respectively. It will be noted therefore that the output of the illustrated transmitters are connected in parallel with the inputs of their associated, respective receivers. The outputs of receivers 84 and 86 are separately connected to the inputs of buffer amplifiers 88 and 90, respectively. The output of amplifiers 88 and 90 are connected to data lines X1 and XN, respectively. Being connected in this fashion, it will be appreciated that the receivers and transmitters are connected in anti-parallel to allow bilateral communication. It will be noted that lines CX1 and CXN are members of the group CX1-21 of FIG. 2, whereas lines X1 and XN are part of the data lines connected to slave computer SL of FIG. 1. Transmitters 80 and 82 have enabling terminals connected to previously illustrated line $\overline{BC}$ for rendering the transmitters operative or inoperative. Similarly, receivers 84 and 86 have enabling terminals commonly connected to previously illustrated line BC. It will be appreciated that since line BC is the inverse of line $\overline{BC}$, when the receivers are enabled the transmitters are not, and vice versa. Connected in this fashion, the equipment can perform simplex communication.

It will further be appreciated that two, essentially identical, antiparallel configurations are shown: group 92 and 94. It will further be appreciated that these two groups are replicated to allow processing of as many data lines as is necessary, this feature being indicated by the ellipses between groups 92 and 94 and their associated lines. The enabling terminals of such additional receivers will be commonly connected to line BC while the enabling terminals of additional transmitters will be commonly connected to $\overline{BC}$.

Figure 7:
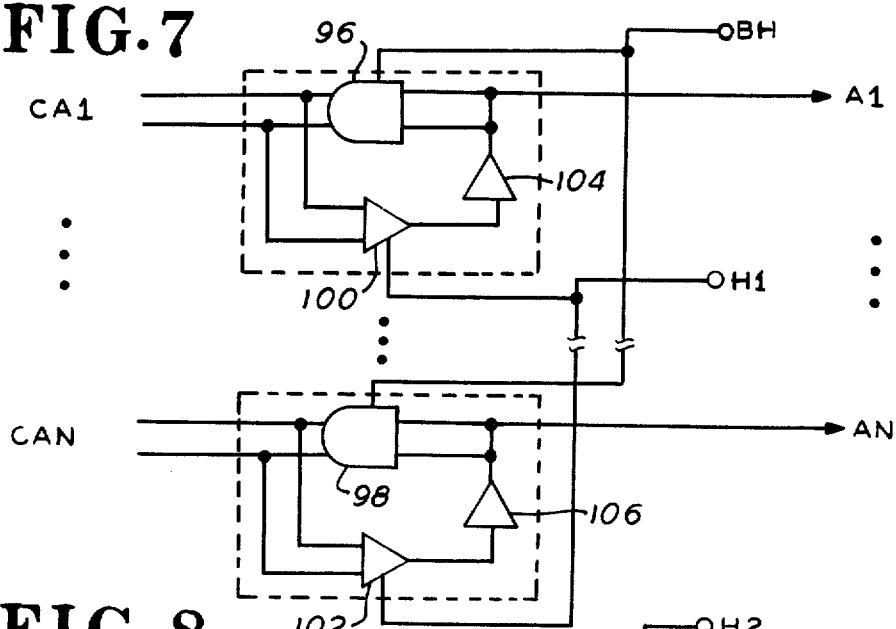
FIG. 7 is a schematic diagram of a fifth portion of the buffer of FIG. 1.

Referring to FIG. 7, a first preselected set from a plurality of transmitting means is shown herein as transmitters 96 and 98. A first preselected group from a predetermined set of controlled receiving means is shown herein as receivers 100 and 102. It will be observed that the circuit diagram herein is identical to that of FIG. 6 except that the circuit points are connected to different lines. Specifically, previously identified lines $\overline{BC}$, X1, BC, XN, CX1, and CXN are replaced by lines BH, A1, H1, AN, CA1 and CAN, respectively. The transmit enable terminals of transmitters 96 and 98 connect to halt line BH which was previously described in FIG. 3, as was, halt line H1. Elements 96, 104, 100, 98, 106 and 102 of this figure correspond to elements 80, 88, 84, 82, 90 and 86, respectively, of FIG. 6. It will again be appreciated that because lines BH and H1 are oppositely phased, either the receivers or the transmitters will be operative but not both. This feature allows for simplex communication to address lines A1-AN of computer SL (FIG. 1).

Figure 8:
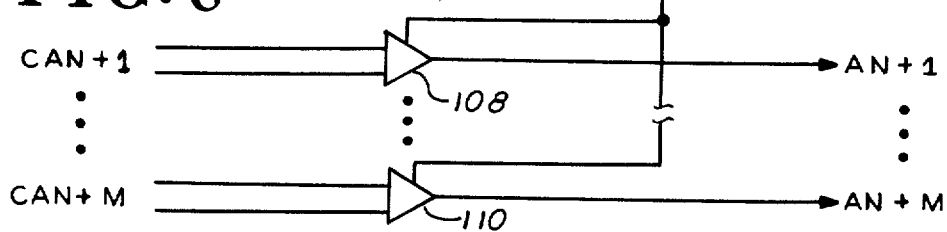
FIG. 8 is a schematic diagram of a sixth portion of the buffer of FIG. 1.

Referring to FIG. 8, a portion of a predetermined set from a plurality of controlled receiving means is shown herein as receivers 108 and 110 whose balanced inputs connect to lines CAN+1 and CAN+M, respectively. The outputs of receivers 108 and 110 connect to address lines AN+1 and AN+M. The receive terminals of receivers 108 and 110 are commonly connected to previously described halt line H2. Again, additional receivers are suggested by the ellipses between the receivers and their input and output lines.

To facilitate an understanding of the principles associated with the foregoing apparatus, its operation will be briefly described. Initially, the general operation of the system of FIGS. 1 and 2 will be reviewed before considering the buffer circuitry in FIGS. 3-8. A unit under test 24 is connected through lines 25 to the measuring and stimulating devices 22. Before starting, if desired, programming instructions can be fed into slave computer SL by operating a tape reader 18 for quick feeding or by actuating manual switches 20 to transmit individual programming words. In this mode, slave computer SL can through line printer 16 or teletypewriter 18 transmit acknowledging responses, inquiries and error signals. However, it is usually simpler for master computer MC to transmit programming information through link 10 and buffer 14.

Because master computer MC is, in this embodiment, a large, general-purpose computer employing many interactive devices such as cathode ray tube 12, initial programming and debugging can be performed more simply and rapidly by dispatching programming instructions from master computer MC. A keyboard associated with cathode ray tube 12 can be used to assemble instructions while its video screen displays the program as well as programming errors. Master computer MC transmits this program over lines 26 through interface 28 (FIG. 2). Microcomputer 30 then sends corresponding control signals on lines 34 and address signals on lines AD directing the transmittal of this program along lines LA/B and into memory 32. Subsequently, the program is retransmitted on lines LA/B through interface 38 onto lines CX1-21 to program slave computer SL (FIG. 1).

Also, master computer MC (FIG. 1) may be used to troubleshoot a unit 24. The slave computer SL can operate the instruments 22 and thereby compile data on the responses and operating parameters of unit 24. Thereafter, an inspector may wish to perform additional tests to refine his diagnosis. Accordingly, an inspector may send from master computer MC instructions to operate certain instruments and stimulating devices in rack 22 and return the associated measurements, as follows: Instructions are initially conveyed on lines 26 (FIG. 2) through interface 28, microprocessor 30 and interface 38, to lines 40. The instructions thus conveyed are coupled through buffer 14 (FIG. 1) to cause slave computer SL to operate the appropriate instruments and stimulating devices in rack 22 (FIG. 1), perform the requested tests and return on lines 23 the requested measurements. Slave computer SL then conveys this information through buffer 14 and line 40 to link 10. This returning information is transmitted on information lines CX1-21 through interface 38 (FIG. 2) onto data lines LEXO-15. Thereafter, the information is relayed through interface 28 to master computer MC on lines 26 so they may be displayed on cathode ray tube 12 (FIG. 1).

Another desirable feature provided by the system of FIGS. 1 and 2 is the display and rewriting of information in the memory of slave computer SL. Also, real time debugging can be performed by means of the master computer. In both of the latter instances, the flow and return of instructions and data is similar to that previously described.

To perform the foregoing functions buffer 14 (FIG. 1) must exchange data at an appropriate time to avoid interfering with internally circulating information on the data and address lines of slave computer SL (FIG. 1). In this embodiment, slave computer SL can receive or transmit five different classes of control signals.

The first three classes are the computer control signals handled by the apparatus of FIGS. 3–5. An enabling signal on line VPa from slave computer SL (FIG. 1) will allow transmission of control signals from the slave computer, including the halt signal of line LSNa (FIG. 3). Depending upon its state, an enabling signal on line VPb (FIG. 4) from slave computer SL (FIG. 1) will allow the master computer MC to either receive from or transmit to slave computer SL computer control signals. Thirdly, depending upon its state, an enabling signal on line VPc (FIG. 5) from slave computer SL (FIG. 1) will allow the master computer MC to either receive from or transmit to slave computer SL computer control signals, including a strobing signal on lines BC and $\overline{BC}$.

These strobing signals on lines BC and $\overline{BC}$, depending upon their state, allow exchange of another class of signals, the data signals of FIG. 6. Thus, in this embodiment, master computer MC (FIG. 1) initiates and directs the direction of an exchange of data on data lines CX1-CXN and X1-XN (FIG. 6) of the master and slave computer.

A final class of signals are those being transmitted to or from address lines A1-AN and AN+1-AN+M (FIGS. 7 and 8). This is a sensitive class of signals and care must be taken to avoid disruption of the slave computer when it is internally processing addresses. Accordingly, this data exchange awaits a halt signal on line LSNa (FIG. 3) from the slave computer. This halt signal can be self-initiated or can be in response to a halt request on lines HALT (FIG. 5) from master computer MC (FIG. 1). In any event, a halt signal on line LSNa (FIG. 3) is coupled through inverters 48, 50 and 52 to the address exchanging equipment of FIGS. 7 and 8. Depending upon the state of the signal on line BH (or its inverses on lines H1 and H2) information is transmitted from or to address lines A1-AN (FIG. 7). Because lines H1 and H2 have the same phase, information is transmitted to address lines AN+1-AN+M at the same time when information is transmitted to lines A1-AN. Because either transmitters 96, 98 or receivers 100, 102, 108, 110 will be enabled, a form of simplex communication will be accomplished between the address lines of FIGS. 7 and 8. This simplex communication will not be disruptive since it only occurs when slave computer SL (FIG. 1) has halted.

It is to be appreciated that various modifications may be implemented with respect to the above described preferred embodiment. For example, additional transmitters and receivers may be added, depending upon the number of simultaneous bits handled by the various computer. Also, these receivers and transmitters can be segregated and separately enabled depending upon the nature of the exchange of information between the computers. Furthermore, different groups of receivers and transmitters can be controlled by the illustrated halt signals depending upon the sensitivity of the associated information lines to the arrival of external signals when a computer is not halted. It is also expected that for situations where simultaneous exchange of data (duplex communication) is required, either the receivers and transmitters will be separated (non-parallel) or multiplexing techniques will be used. Also while conventional receivers and transmitters formed of integrated circuits are suggested herein, in other embodiments, discrete components may be employed. Alternatively, other embodiments may employ a larger scale of integration thereby containing a larger portion of the circuitry in a single package. In other embodiments, the command to operate certain receivers or transmitters might come from a different computer (a slave computer may be influential instead of the master computer and vice versa). It is also expected, that numerous circuit modifications and component substitutions can be invoked depending upon the desired speed, capacity, power, noise immunity, etc.

Obviously, many modifications and variations of the present invention are possible in light of the above teachings. It is therefore to be understood that within the scope of the appended claims, the invention may be practiced otherwise than as specifically described.

What is claimed is:

1. A buffer for exchanging data between a device and a computer, the former having means for providing a plurality of device signals, the latter having a plurality of lines including a halt line, said halt line being operable to transmit a halt signal when said computer has halted, said buffer comprising:

a plurality of transmitting means, including a halt transmitter, each separately connected to predetermined respective ones of said plurality of lines, each of said plurality of transmitting means being operable to transmit its signal to said device, said halt transmitter being connected to said halt line for transmitting said halt signal to said device; and a plurality of receiving means connected between said device and given respective ones of said plurality of lines for coupling to them said device signals from said device, said given respective ones of said lines and said predetermined respective ones of said lines having at least one common member, each one of a predetermined set from said plurality of receiving means having a control means for controlling said predetermined set, said control means having a receive terminal commonly connected to said halt line for enabling operation of said predetermined set in response to said halt signal, the presence and absence of said halt signal on said halt line being effective to enable and disable, respectively, said predetermined set from said plurality of receiving means.

2. A buffer according to claim 1 wherein a first preselected set from said plurality of transmitting means are connected in antiparallel with a first preselected group from said plurality of receiving means, said first preselected set and group being connected to and controlled by said computer to render them alternately operable to allow simplex communication between said device and said computer.

3. A buffer according to claim 2 wherein those of said given respective ones of said lines connecting to said first preselected group comprise address lines for said computer.

4. A buffered test system according to claim 1, 2 or 3 wherein said device is a digital computing device.

5. A buffer according to claim 2 wherein each of said first preselected set includes a transmit terminal commonly connected to said halt line for transmitting in response to said halt signal but at a time different from when said predetermined set is enabled to operate by said halt signal.

6. A buffer according to claim 2 wherein a second preselected set from said plurality of transmitting means are connected in antiparallel with a second preselected group from said plurality of controlled receiving means, said second preselected set and group being connected to and controlled by said computer to render them alternately operable to allow simplex communication.

7. A buffer according to claim 6 wherein those of said given respective ones of said lines connecting to said second preselected group comprise data lines of said computer.

8. A buffer according to claim 7 wherein said plurality of lines includes a plurality of control lines, and wherein a third preselected set from said plurality of transmitting means are connected to a portion of said control lines, the remaining ones of said control lines being connected to a third preselected group from said plurality of controlled receiving means.

9. In a tester having at least one unit to be tested and a remote device for providing a plurality of device signals, a buffered test system for testing said unit with said remote device, comprising:
   a test instrument having a test terminal which is connectable to said unit to measure an operating parameter thereof, said test instrument being operable to provide measurement signals;
   a computer having a plurality of lines for providing thereon a plurality of signals, at least one of said lines being connected to said test instrument for sending it a signal to commence operation and for receiving from it a measurement signal;
   a plurality of transmitting means separately connected to predetermined respective ones of said plurality of lines for transmitting to said device their signals, including one corresponding to said measurement signal; and
   a plurality of receiving means connected between said device and given respective ones of said plurality of lines for coupling to them said device signals from said device, said given respective ones of said lines and said predetermined respective ones of said lines having at least one common member, said plurality of lines including a halt line operable to transmit a halt signal when said computer has halted, said plurality of transmitting means including a halt transmitter connected to said halt line for transmitting said halt signal to said device, each of a predetermined set from said plurality of receiving means having a control means for controlling said predetermined set, said control means having a receive terminal commonly connected to said halt line for enabling operation of said predetermined set, the presence and absence of said halt signal on said halt line being effective to enable and disable, respectively, said predetermined set from said plurality of receiving means.

10. A method for exchanging data between a device, a test instrument and a computer having a plurality of lines including a halt line operable to convey a halt signal when said computer has halted, said device being operable to provide device signals, comprising the steps of:
   transmitting signals from predetermined respective ones of said plurality of lines to said device;
   coupling said device signals from said device to given respective ones of said plurality of lines when a halt signal is provided by said computer on said halt line;
   providing onto said plurality of lines a predetermined signal from said computer after the provision of said halt signal;
   rendering said test instrument operative when said predetermined signal is provided on said plurality of lines by said computer; and
   relaying measurements obtained by said instrument through said plurality of lines.

* * * * *